United States Patent
Marshall et al.

(10) Patent No.: US 8,686,744 B2
(45) Date of Patent: Apr. 1, 2014

(54) PRECISION MEASUREMENT OF CAPACITOR MISMATCH

(75) Inventors: Andrew Marshall, Dallas, TX (US);
Md. Imran Hossain, Plano, TX (US);
Michelle N. Nguyen, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 924 days.

(21) Appl. No.: 12/839,532

(22) Filed: Jul. 20, 2010

(65) Prior Publication Data
US 2012/0019263 A1    Jan. 26, 2012

(51) Int. Cl.
*G01R 27/26* (2006.01)

(52) U.S. Cl.
USPC ...... 324/658; 324/678; 324/537; 324/754.23; 702/2; 702/65

(58) Field of Classification Search
USPC .......................................................... 324/658
See application file for complete search history.

(56) References Cited

U.S. PATENT DOCUMENTS

| | | | | |
|---|---|---|---|---|
| 3,668,523 A * | 6/1972 | Kuhn | ........................ | 324/754.23 |
| 3,840,809 A * | 10/1974 | Yun | ................................ | 324/658 |
| 4,504,779 A * | 3/1985 | Haman | ........................ | 323/349 |
| 5,202,640 A * | 4/1993 | Schaaf et al. | ................. | 324/537 |
| 6,028,990 A | 2/2000 | Shahani et al. | | |
| 6,084,285 A * | 7/2000 | Shahani et al. | ................ | 257/532 |
| 6,275,047 B1 * | 8/2001 | Zoellick et al. | ................ | 324/678 |
| 6,633,136 B2 * | 10/2003 | Kim et al. | ................... | 315/169.3 |
| 6,891,486 B1 | 5/2005 | Pentakota et al. | | |
| 7,136,006 B2 | 11/2006 | Koh et al. | | |
| 7,233,191 B2 * | 6/2007 | Wang et al. | .................... | 327/430 |
| 7,492,399 B1 * | 2/2009 | Gulbransen et al. | .......... | 348/294 |
| 7,863,909 B2 * | 1/2011 | Keith | ............................. | 324/678 |
| 2002/0060524 A1 * | 5/2002 | Kim et al. | .................. | 315/169.3 |
| 2003/0184315 A1 * | 10/2003 | Eberlein | ........................ | 324/658 |
| 2006/0109021 A1 * | 5/2006 | Savithri | ........................ | 324/765 |
| 2008/0059090 A1 * | 3/2008 | Kim | ................................. | 702/65 |
| 2008/0246512 A1 * | 10/2008 | Seth et al. | ........................ | 326/83 |
| 2010/0060346 A1 * | 3/2010 | Ogiwara et al. | ............... | 327/543 |
| 2010/0153079 A1 * | 6/2010 | Choi | ................................ | 703/2 |

OTHER PUBLICATIONS

Tuinhout, H. P., H. Elzinga, J. T. Brugman, F. Postma, "Accurate Capacitor Matching Measurements using Floating Gate Test Structures", Proc. IEEE 1995 Int. Conference on Microelectronic Test Structures, vol. 8, Mar. 1995, pp. 133-137.*

(Continued)

*Primary Examiner* — Benjamin M Baldridge
(74) *Attorney, Agent, or Firm* — Jacqueline J. Garner; Wade J. Brady, III; Frederick J. Telecky, Jr.

(57) ABSTRACT

Circuitry and methods for measuring capacitive mismatch with improved precision. The capacitors under measurement are connected in series in a voltage divider, with the node common to both capacitors connected to the gate of a source follower transistor. In one disclosed embodiment of the invention, a ramped voltage is applied to the drain of the source follower transistor simultaneously with the ramped voltage applied to the voltage divider; the slope of the ramped drain voltage is at the nominal slope of the voltage at the common node of the voltage divider. In another embodiment, a second transistor in saturation has its gate coupled to the source of the source follower device, and its source connected to the drain of the source follower device in series with a constant voltage drop. The drain-to-source voltage of the source follower device is thus held constant in each embodiment, improving precision of the measurement.

16 Claims, 4 Drawing Sheets

(56) References Cited

OTHER PUBLICATIONS

Hunter, Jim, Prasad Gudem, Steven Winters, "A Differential Floating Gate Capacitance Mismatch Measurement Technique", 2000 Int. Conference on Microelectronic Test Structures, © 2000 IEEE, pp. 142-147.*

Furukawa, Masakazu, Hidetoshi Hatano, Koji Hanihara, "Precision Measurement Technique of Integrated MOS Capacitor Mismatching Using a Simple On-Chip Circuit", IEEE Transactions on Electron Devices, vol. ED-33, No. 7, Jul. 1986, © 1986 IEEE.*

Kortekaas, "On-chip Quasi-Static Floating-gate Capacitance Measurement Method", Int. Conf. on Microelectronic Test Structures, vol. 5 (IEEE, Mar. 1990), pp. 109-113.

Promitzer, "12-bit Low-Power Fully Differential Switched Capacitor Noncalibrating Successive Approximation ADC with 1 MS/s", J. Solid State Circ., vol. 36, No. 7 (IEEE, Jul. 2001), pp. 1138-1143.

McCreary et al., "All-MOS Charge Redistribution Analog-to-Digital Conversion Techniques—Part I", J. Solid State Circ., vol. SC-10, No. 6 (IEEE, 1975), pp. 371-379.

Tan et al., "Error Correction Techniques for High-Performance Differential A/D Converters", J. Solid State Circ., vol. 25, No. 6 (IEEE, 1990), pp. 1318-1327.

* cited by examiner

PRECISION MEASUREMENT OF CAPACITOR MISMATCH

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of solid-state integrated circuit measurement. Embodiments of this invention are directed to measurement of capacitor mismatch in integrated circuits, and more particularly to the measurement of capacitor mismatch between capacitors of different construction from one another.

As is fundamental in the art, the controlled and successful manufacture of integrated circuits requires measurement of various parameters and behavior in the manufactured devices. In many modern integrated circuits, one particularly important parameter is capacitance, including both the capacitance of structures that are intended to be capacitors in the circuit function itself, and also the parasitic capacitance exhibited by conductors, transistors (e.g., junction capacitance, gate capacitance), and other circuit features. Manufacturing variations, temperature dependence, voltage dependence, and other variations in manufacturing parameters and operating conditions cause variations in the capacitance exhibited by a given structure over a population of manufactured integrated circuits, and also variations in capacitance among capacitors within a given integrated circuit.

Some modern integrated circuits are particularly sensitive to capacitor mismatch within their circuit functions. For example, modern analog-to-digital converters (ADCs) are particularly sensitive to capacitor mismatch and variations in capacitance. As known in the art, switched-capacitor ADCs rely on one or more weighted capacitor arrays to provide a digital estimate of a sampled input analog signal; mismatches among capacitors within an array result in variations from the binary-weighting or other weighting scheme, and non-linearities in the digital output. Differential switched-capacitor ADCs and double-sampling switched-capacitor ADCs are also subject to mismatch between capacitors in different arrays, giving rise to conversion errors. Other types of ADCs, such as pipelined ADCs, as well as other analog and digital integrated circuit functions, are also vulnerable to capacitor mismatch.

In addition to capacitor mismatch due to manufacturing variations, capacitor mismatch is necessarily present between capacitors of different structure. For example, the array capacitors in many modern ADCs are constructed as metal-to-metal capacitors, with parallel plates formed in first and second metal layers in the integrated circuit. Other capacitors in the same circuit may be formed with a polysilicon plate overlying a parallel plate in an active region in the underlying substrate or well region. Parasitic capacitances of switching transistors in the ADCs are essentially poly-to-active capacitors. The behavior of the poly-to-substrate capacitor with voltage is substantially different from that of a metal-to-metal capacitor, considering the effect on stored charge by changes in the depletion region in substrate, over variations in voltage.

Capacitance variations and capacitor mismatch have been addressed in the design of modern ADCs. Examples of calibration and correction techniques are described in U.S. Pat. Nos. 7,136,006 and 6,891,486, both commonly assigned herewith, and in Tan et al., "Error Correction Techniques for High-Performance Differential A/D Converters", *J. Solid-State Circ.*, Vol. 25, No. 6 (IEEE, 1990), pp. 1318-27, all of which are incorporated herein by reference.

For purposes of calibration, trimming, and process control, it is of course useful to measure capacitor behavior in manufactured devices, for example in wafer form along with functional and parametric electrical test. A conventional circuit for measuring mismatch between capacitors is shown in FIG. 1. Capacitors C1, C2 are the capacitors to be compared with one another in this circuit, and are connected in series between terminals V1, V2. In practice, capacitor C2 may be a "reference" capacitor, against which the capacitance of capacitor C1 is to be measured. Node VINT between capacitors C1, C2 is connected to the gate of p-channel metal-oxide-semiconductor (MOS) transistor 4, the drain of which is at ground and the source of which is connected through current source 2 to bias voltage $V_{dd}$. The body of transistor 4 is connected to its source, in this example.

In operation, current source 2 is biased to produce a constant current I1, and bias voltage $V_{dd}$ is sufficiently positive (relative to the ground voltage at the drain of transistor 4) to place transistor 4 in saturation. As well-known in the art, transistor 4 operates as a "source follower" under those conditions; because transistor 4 is in saturation, the constant source-drain current I1 forces its gate-to-source voltage $V_{gs}$ to be constant. As such, output voltage VOUT at the source of transistor 4 follows changes in the voltage at its gate, which is at node VINT.

To perform measurement of the relative capacitances of capacitors C1, C2 in this conventional arrangement, the voltage at node V2 is held constant (e.g., at ground) and the voltage at node V1 is ramped over time. The voltage at intermediate node VINT will respond to the ramped voltage V1 by also ramping, but at a flatter slope according to the voltage divider of capacitors C1, C2:

$$VINT(t) = V1(t) \cdot \left( \frac{C1}{C1 + C2} \right)$$

Ideally, the output voltage VOUT from the source follower of transistor 4 increases with the ramping voltage VINT(t) at the same slope S:

$$S = \frac{C1}{C1 + C2}$$

By determining the slope of VOUT(t) in response to the ramped voltage at node V1, one can then determine the relative capacitances of capacitors C1, C2:

$$\frac{C2}{C1} = \frac{S}{(1-S)}$$

In practice, however, the behavior of the source follower circuit of FIG. 1 is not ideal, especially in modern sub-micron transistors. In the circuit of FIG. 1, the drain-to-source voltage of transistor 4 changes as the voltage at node VINT increases. This modulation of the drain-to-source voltage causes some of the changes in the gate voltage to be consumed in charging or discharging parasitic junction capacitances in the device. Furthermore, due to the mechanism of drain-induced barrier lowering, transistor threshold voltages modulate in response to changes in drain-to-body node voltage. These effects cause the slope of output voltage VOUT(t) to not purely reflect the relative capacitances of capacitors C1, C2, but will also reflect capacitive effects and also variations in the threshold voltage of transistor 4 over the duration of the measurement. The resulting output voltage VOUT(t) will thus include non-linearities, which can be substantial. For example, threshold voltage modulation of on the order of 10 mV has been observed, in connection with this invention, for an example of transistor 4 with a nominal threshold voltage of about 0.35 volts. The resulting inaccuracy in capacitance measurement is incompatible with capacitors such as those intended for precision circuits such as high-performance ADCs.

BRIEF SUMMARY OF THE INVENTION

Embodiments of this invention provide a circuit and method of measuring integrated circuit capacitors with improved accuracy.

Embodiments of this invention to provide such a circuit and method that is compatible with high-performance devices, such as those fabricated using sub-micron feature sizes.

Embodiments of this invention provide such a circuit that does not require changes in the testing methodology from conventional circuits.

Embodiments of this invention provide such a method that does not require changes in the circuit used for the measurement.

Other objects and advantages of this invention will be apparent to those of ordinary skill in the art having reference to the following specification together with its drawings.

This invention may be implemented into a circuit and method of measuring the capacitance ratio between two capacitors arranged in a voltage divider, using a circuit including a source follower transistor for which its drain-to-source voltage is held constant. By maintaining the drain-to-source voltage of the source follower device substantially constant while the voltage applied to the capacitor voltage divider ramps, parasitic capacitances do not affect the device performance and shifts in threshold voltage are avoided. The output voltage at the source of the source follower transistor thus accurately reflects the capacitance ratio.

According to one aspect of the invention, the drain-to-source voltage is held constant by ramping the drain voltage of the source follower transistor with the voltage applied to the capacitor voltage divider. The time rate of change of the drain voltage corresponds to the time rate of change of the applied ramp voltage, multiplied by the voltage divider ratio to follow the ramping voltage of the common node between the capacitors.

According to another aspect of the invention, the drain-to-source voltage is maintained constant by including a second transistor with its gate at the source of the source follower transistor, and its source coupled to the drain of the source follower transistor via a known voltage drop. The second transistor is biased into its saturation region, so that its gate-to-source voltage remains constant with variations at its gate (which follow the ramping of the applied voltage). The drain of the source follower transistor thus also ramps with the voltage at its gate, via this second transistor.

DETAILED DESCRIPTION OF THE INVENTION

This invention will be described in connection with its preferred embodiment, namely as implemented into an semiconductor wafer as a scribe line test device for measuring capacitor mismatch between capacitors of different construction, as it is contemplated that this invention is especially beneficial when realized in such an arrangement. It is also contemplated, however, that this invention may be realized in many other implementations, including as a test structure within an integrated circuit die, or as a functionally accessible circuit contained within the integrated circuit itself, and for measuring relative capacitances of various capacitors, including those of similar construction to one another. Accordingly, it is to be understood that the following description is provided by way of example only, and is not intended to limit the true scope of this invention as claimed.

Figure 2A:
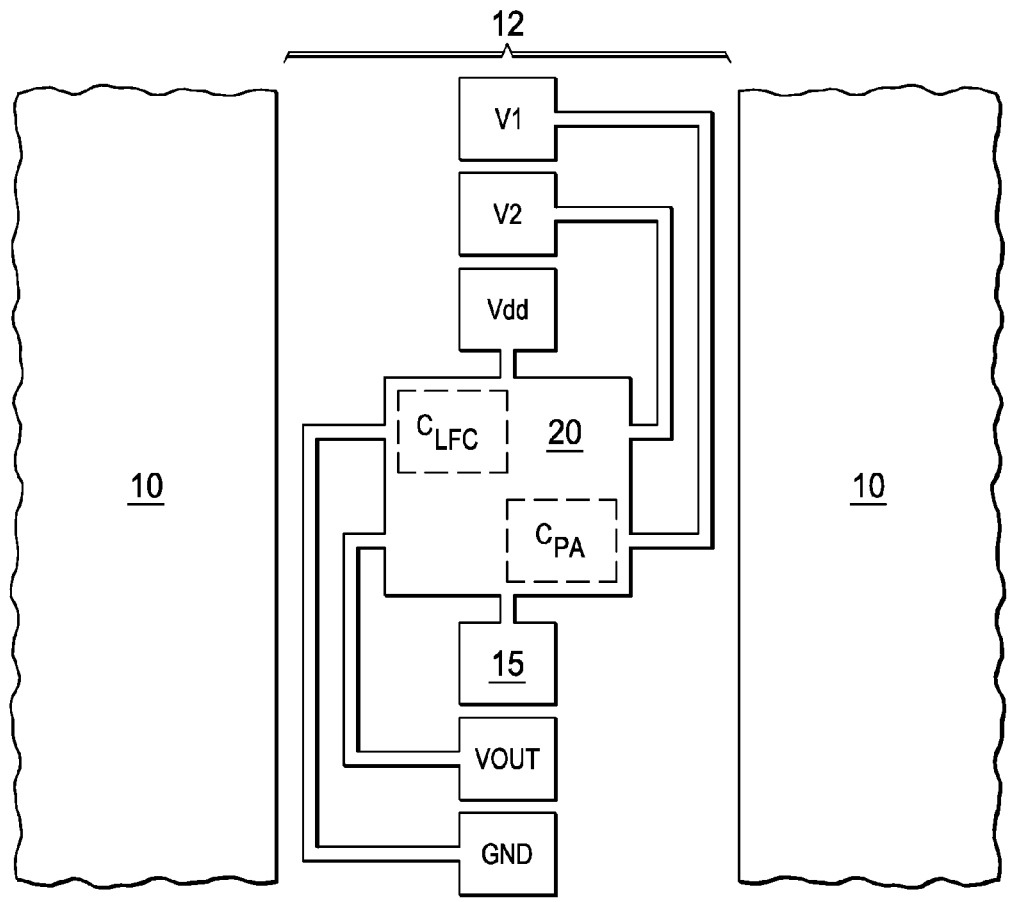
FIG. 2a is a plan view of a portion of a semiconductor wafer illustrating the placement of a circuit for measuring capacitances according to embodiments of the invention.

FIG. 2a illustrates, in plan view, the surface of a portion of a semiconductor wafer at which multiple integrated circuit die 10 have been formed. As evident from FIG. 2a and as well known in the art, fabricated integrated circuit die 10 are typically arranged in a regular fashion at the surface of semiconductor wafer, such as arranged in rows and columns in array fashion. Neighboring die 10 are separated by scribe line 12, which allows separation of die 10 from one another following fabrication and such electrical testing as desired.

In these embodiments of the invention, capacitor mismatch test circuit 20 is disposed within scribe line 12 between neighboring die 10, as shown. Test circuit 20 includes capacitors $C_{LFC}$, $C_{PA}$, which are the capacitors to be measured relative to one another. Various probe pads are provided to allow electrical access to test circuit 20, including pads V1, V2 at which an electrical stimulus can be applied, pads $V_{dd}$ and GND for receiving the $V_{dd}$ power supply and ground voltages, respectively, and pad VOUT at which the response of test circuit 20 to that stimulus can be sensed. An additional pad (or pads) 15 is provided in this example for other signals and bias voltages, as will be evident from the following description. In addition or alternatively to separate pads, conductors may be routed to test circuit 20 to provide the $V_{dd}$ power supply and ground voltages, in common among integrated circuit die 10 and other instances of test circuit 20 on the same wafer.

The particular layout and arrangement of test circuit 20, whether within scribe line 12 or within the bounds of integrated circuit die 10, can vary widely from that illustrated in FIG. 2a. It is contemplated that those skilled in the art having reference to this description will recognize that the arrangement of FIG. 2a is provided by way of context and example only.

As mentioned above, capacitors $C_{LFC}$, $C_{PA}$ in these embodiments of test circuit 20 may be of different construction from one another, such that test circuit 20 operates to measure the capacitance of one against the other. Such capacitor "mismatch" measurement is useful in monitoring variations in the fabrication of integrated circuit die 10, and in enabling "trimming" and other adjustment of the functional operation of these integrated circuit die 10 to compensate for such mismatch. In this example, capacitor $C_{LFC}$ is a metal-to-metal lateral fluxcapacitor and capacitor $C_{PA}$ is a polysilicon-to-active capacitor. Examples of capacitors $C_{LFC}$, $C_{PA}$ are shown in simplified cross-section in FIGS. 2b and 2c, respectively.

Figure 2B:
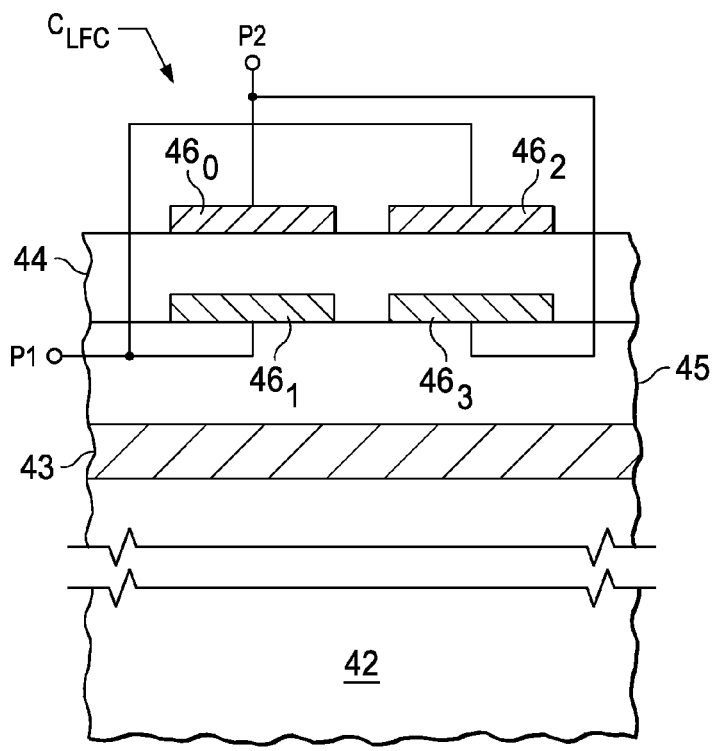
FIGS. 2b and 2c are cross-sectional views of the structure of FIG. 2a, illustrating the structure of first and second capacitors in that circuit, according to embodiments of this invention.

As shown in the example of FIG. 2b, capacitor $C_{LFC}$ has four metal elements $46_0$ through $46_3$, with elements $46_0$ and $46_2$ on one side of dielectric film 44, opposed by elements $46_1$ and $46_3$, respectively. Elements $46_0$ and $46_2$ on the same side of dielectric film 44 are disposed near one another, as are opposed elements $46_1$ and $46_3$, to provide additional capacitance from lateral flux, as is well known in the art. In this example, metal elements $46_1$ $46_3$ are formed in a lower level of metal conductor (e.g., aluminum, tungsten, copper, alloys thereof, etc.), separated from substrate 42 by isolation dielectric structure 43 and interlevel dielectric layer 45. Metal elements $46_0$, $46_2$ are formed in a higher level of metal conductor (e.g., aluminum, tungsten, copper, alloys thereof, etc.), separated from first level metal elements $46_1$, $46_3$ by dielectric film 44. The composition of dielectric film 44 and interlevel dielectric layer 45 can be any one or more of conventional dielectric films, including silicon dioxide, silicon nitride, organic dielectric materials, and the like. Conductors (not shown) are routed and make contact to metal elements $46_0$ through $46_3$ in the well-known cross-coupled fashion for lateral flux capacitors, as indicated schematically by terminals P1, P2, respectively. Typically, also as known in the art for lateral flux capacitors, elements $46_0$ through $46_3$ will meander about the surface of substrate 42 in a fractal or other pattern, to attain the desired capacitance value. Of course, a similar construction as that shown in FIG. 4b can be used to realize a parallel-plate metal-to-metal capacitor between two metal elements 46 in the usual manner, if desired.

Figure 2C:
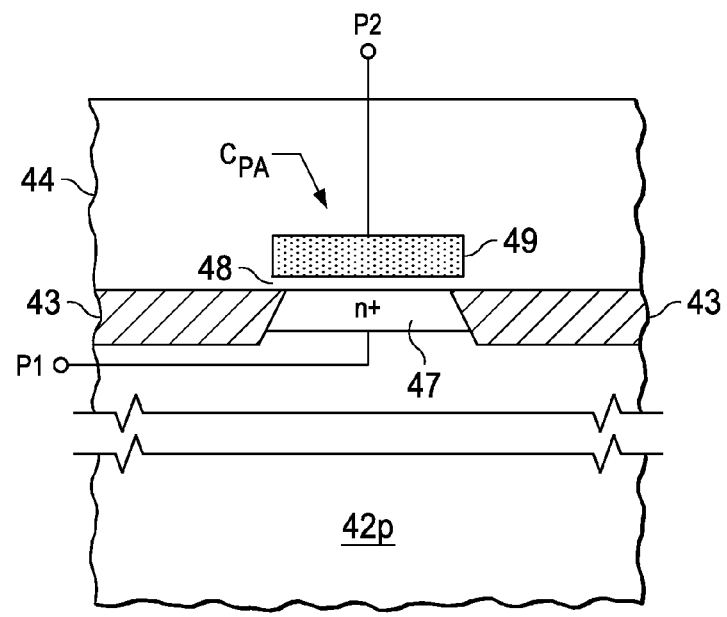

FIG. 2c illustrates, in cross-section, the construction of capacitor $C_{PA}$ at a different location of the same semiconductor wafer as capacitor $C_{LFC}$. In this case, active region 47 is an n+ doped region formed into p-type substrate 42; alternatively, active region 47 may be a heavily-doped p-type region formed into n-type substrate 42. In either case, substrate 42 may be the bulk material of the wafer substrate, a p-type doped well formed into substrate 42, or a silicon-on-insulator layer isolated from the wafer substrate, among other alternatives. Active region 47 is defined by isolation dielectric structures 43 in the conventional manner; isolation dielectric structures 43 may be formed by conventional shallow trench isolation, LOCOS processes, or the like. Active region 47 serves as one plate of capacitor $C_{PA}$, to which a conductor (not shown) makes electrical contact as indicated schematically by terminal P1. The second plate of capacitor $C_{PA}$ is defined by polysilicon electrode 49, which is formed in the conventional manner for the transistor gate level in the integrated circuit. Gate dielectric 48 serves as the capacitor dielectric in this example, and is disposed between polysilicon electrode 49 and the surface of active region 47 as shown. A conductor (not shown) makes electrical contact to polysilicon electrode 49, as indicated schematically by terminal P2. Interlevel dielectric layer 45 is disposed over polysilicon electrode 49 as shown; higher levels such as dielectric film 44 and the metal layers forming metal elements 46 (FIG. 2a) are disposed over capacitor $C_{PA}$ as desired for the particular circuit layout.

The capacitance of capacitor $C_{LFC}$ is of course defined by the cross-sectional area of the plates defined by metal elements $46_1$, $46_2$, the distance between those plates, and the dielectric properties of dielectric film 44. Similarly, the capacitance of capacitor $C_{PA}$ is established by the cross-sectional area of active region 47 that underlies polysilicon electrode 49, the thickness of gate dielectric 48, and the dielectric properties of gate dielectric 48. As a result, because the construction of capacitor $C_{LFC}$ differs from that of capacitor $C_{PA}$, manufacturing variations will affect capacitors $C_{LFC}$ and $C_{PA}$ differently. Accordingly, these manufacturing variations can often result in capacitor mismatch between capacitors $C_{LFC}$ and $C_{PA}$, even if these capacitors are designed to have the same nominal capacitance as one another. Furthermore, the capacitance of capacitor $C_{PA}$ will be somewhat voltage-dependent, due to the changes in the depletion region of active region 47 with voltage; capacitor $C_{LFC}$ has no similar voltage dependency, because of its construction. Especially in modern high-performance circuits constructed from minimum feature size elements, measurement and compensation for such mismatch is important.

Figure 3A:
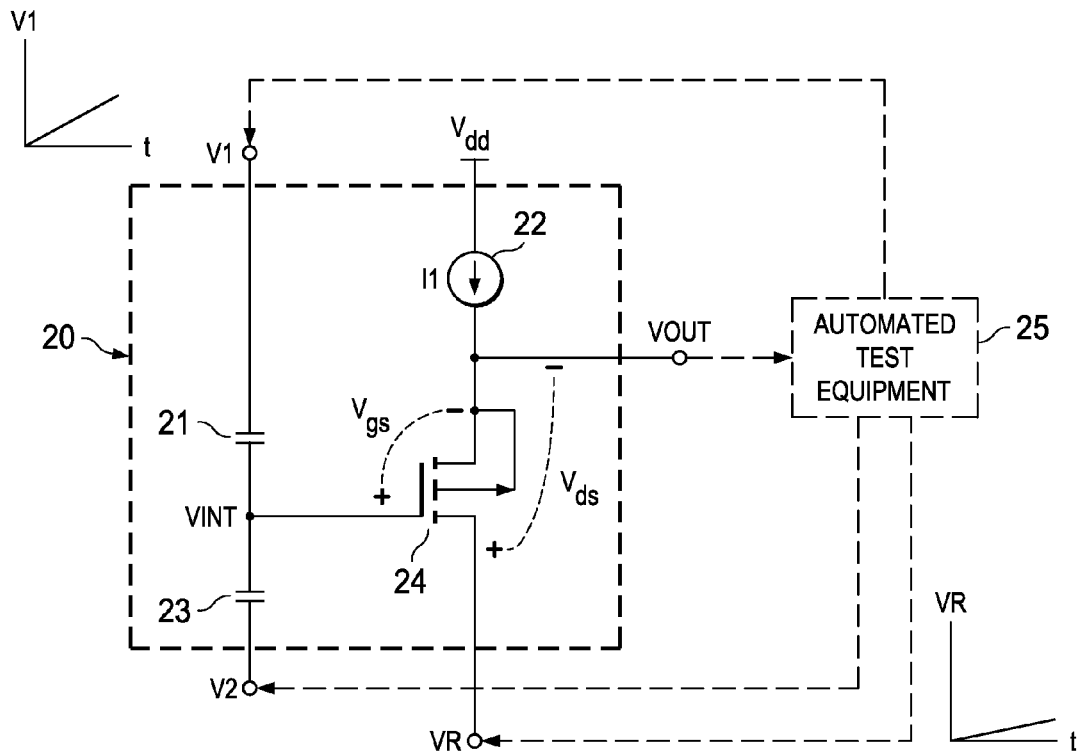
FIG. 3a is an electrical diagram, in schematic form, of a circuit for measuring capacitances according to an embodiment of the invention.

FIG. 3a schematically illustrates test circuit 20 for use according to a first embodiment of the invention. In this embodiment of the invention, capacitors 21, 23 are connected in series between voltage terminals V1, V2. Capacitors 21, 23 can correspond to capacitors $C_{LFC}$, $C_{PA}$ of FIGS. 2a through 2c; the selection of which of capacitors $C_{LFC}$, $C_{PA}$ corresponds to which of capacitors 21, 23 is not of importance. Intermediate node VINT between capacitors 21, 23 is connected to the source of p-channel MOS transistor 24. The drain of transistor 24 is connected to reference voltage terminal VR, and the source of transistor 24 is connected to terminal VOUT and connected through current source 22 to power supply voltage $V_{dd}$. The body node of transistor 24 is connected to its source node, or alternatively to a substrate connection if desired. Current source 22 is a conventional current source device, such as a MOS transistor biased by way of a reference voltage to conduct a substantially constant current; a current mirror or other circuit for providing a substantially constant current may also be used.

Of course, it is contemplated that transistor 24 may alternatively be realized as an n-channel MOS transistor, in which case output terminal VOUT would be connected to the source of that n-channel device (on the opposite side of the gate from that shown in FIG. 3a). These and other variations are contemplated to be evident to those skilled in the art having reference to this specification.

In test circuit 20 of this embodiment of the invention, transistor 24 is biased into its saturation region, and operates as a source follower device by virtue of current source 22 providing a substantially constant source-drain current I1. This constant source-drain current I1 causes transistor 24 to have a constant gate-to-source voltage. Changes in the voltage at the gate of transistor 24, presented at intermediate node VINT, are thus reflected directly at output terminal VOUT.

The precision with which the voltage at output terminal VOUT tracks the voltage at intermediate node VINT depends in large part on the operation of current source 22 to provide constant current I1. Accordingly, for purposes of this description, the "substantially constant" current I1 to be provided by current source 22 refers to a current that is sufficiently constant to meet the desired precision of the capacitance measurement.

As shown in FIG. 3a, automated test equipment 25 is connected to terminals V1, VR, and VOUT of test circuit 20; alternatively, internal circuitry within an integrated circuit embodying test circuit 20, or laboratory bench equipment, can similarly interface with test circuit 20 in this manner. In operation, according to this example, bias terminal V2 is biased to a reference voltage such as ground; power supply voltage $V_{dd}$ is applied to current source 22 as shown in FIG. 3. According to this embodiment of the invention, the measurement of the relative capacitances of capacitors 21, 23 is performed by automated test equipment 25 (or other circuitry, as mentioned above) ramping the voltage applied to bias terminal V1 at a selected time rate of change, beginning from a low voltage such as that applied to terminal V2. Simultaneously with the ramped voltage at terminal V1, automated test equipment 25 applies an increasing voltage over time at bias terminal VR, also beginning from a low voltage such as ground. The time rate of change of the voltage applied to terminal VR relative to that of the voltage applied to terminal V1 is selected to maintain a substantially constant drain-to-source voltage drop across transistor 24, according to this invention. Of course, for ease of calculations and measurement, the time rate of change of the voltages at terminals V1, VR should remain constant over time (i.e., a linear ramp of voltage). Terminals V1, V2, VR, and VOUT may be realized by way of test pads 15, for those implementations of test circuit 20 within scribe line 12 of a semiconductor wafer, as shown in FIG. 2a.

Figure 3B:
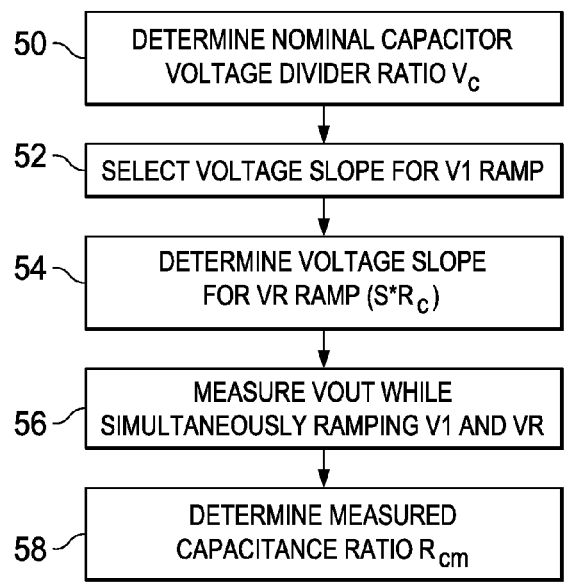
FIG. 3b is a flow diagram illustrating a test sequence using the circuit of FIG. 3a to measure capacitances according to that embodiment of the invention.

Referring now to FIG. 3b, the operation of test circuit 20 of FIG. 3a to measure the relative capacitances of capacitors 21, 23 according to this embodiment of the invention will now be described. In process 50, the nominal capacitor voltage divider ratio $V_C$ presented by capacitors 21, 23 is determined. Typically, this nominal voltage divider ratio $V_C$ will be determined a priori, for example from the circuit design or as based on actual measurements of dielectric properties and feature sizes for the lot or wafer of the instance of test circuit 20 being measured. The voltage divider ratio $V_C$ corresponds to the rate at which the voltage at intermediate node VINT will ramp relative to the ramping of the applied voltage at terminal V1.

According to rudimentary circuit analysis, the voltage at intermediate node VINT between capacitors 21 and 23 can be derived as follows:

$$VINT(t) = \left(\frac{C21}{C23 + C21}\right)[V1(t) - V2]$$

where V1(t) is the time-dependent voltage at terminal V1, and VINT(t) is the time-dependent voltage at intermediate terminal VINT, and where C21 and C23 are the nominal capacitances of capacitors 21, 23, respectively. Accordingly, the capacitor voltage divider ratio $C_P$ can be readily derived in process 50 from the nominal capacitances C21, C23:

$$C_P = \frac{C21}{C23 + C21}$$

In process 52, the time rate of change (i.e., slope) of the voltage to be applied to terminal V1 in the measurement is selected or otherwise identified. And in process 54, the time rate of change (i.e., slope) of the voltage to be applied to terminal VR is then determined as the product of voltage divider ratio $C_P$ and the slope S of the voltage ramp at terminal V1.

Referring back to FIG. 3a, the effect of this ramping of the voltage at terminal VR along with that at terminal V1 will now be described. As described above, the voltage divider ratio $C_P$ corresponds to the fraction of the voltage at terminal V1 that appears at intermediate node VINT. Accordingly, if the slope over time of the voltage at terminal V1 is S, then the slope of the voltage at intermediate terminal VINT will correspond to the product of the voltage divider ratio $C_P$ and the slope S. This product is, as described above, determined in process 54 as the slope over time of the voltage to be applied to terminal VR. As such, the voltage at terminal VR will be ramped by automated test equipment 25 at the same rate of change as the voltage at terminal VINT.

As described above, transistor 24 operates as a source follower, given that a constant source-drain current is being supplied by current source 22. With transistor 24 in its saturation region, which occurs upon application of a sufficiently high power supply voltage $V_{dd}$, the gate-to-source voltage of transistor 24 will remain constant. As the voltage at intermediate node VINT increases over time as the voltage at terminal V1 is ramped, so too will the output voltage at terminal VOUT. And because the voltage at terminal VR at the drain of transistor 24 is ramping at the same rate as the voltage at intermediate node VINT, the drain-to-source voltage of transistor 24 will remain constant.

Referring back to FIG. 3b, the voltages at terminals V1, VR are then simultaneously ramped in process 56, during which time the voltage at terminal VOUT is measured. The use of automated test equipment 25 to apply these voltages and measure the response of course facilitates process 56. The slope of time-dependent voltage VOUT(t) measured in process 56 at terminal VOUT in response to the ramped voltage at node V1 is then used to determine the relative capacitances of capacitors 21, 23 from:

$$\frac{C23}{C21} = \frac{S}{(1-S)}$$

In process 58, automated test equipment 25 or other alternative circuitry or methodology determines the slope S of the output voltage VOUT(t), and from that slope S solves for the relative ratio of capacitances C23/C21. To the extent that this ratio deviates from that expected based on the nominal capacitances C21, C23, that deviation will correspond to the capacitive mismatch between capacitors 21, 23. The measurement process according to this embodiment of the invention thus provides insight into the manufacturing variations of the current wafer, and in some cases, can be used to apply the appropriate circuit compensation for that mismatch.

As mentioned above, the ramping of the applied voltage at terminal VR simultaneously with the voltage at terminal V1, at the reduced slope corresponding to voltage divider ratio $C_P$, causes the drain-to-source voltage of transistor 24 to remain substantially constant, even as the source voltage (at terminal VOUT) rises with the rising voltage at intermediate node VINT. By maintaining both the drain-to-source voltage and the gate-to-source voltage constant, the parasitic capacitances presented by transistor 24 to intermediate node VINT remain constant over the applied voltage range. The resulting source voltage at terminal VOUT is thus not non-linearly affected by the charging and discharging of these device parasitic capacitances. In addition, shifting of the threshold voltage of transistor 24 due to drain effects is greatly reduced according to this embodiment of the invention. The resulting measurement of capacitive mismatch is thus more precise according to this embodiment of the invention than according to conventional techniques.

Figure 4A:
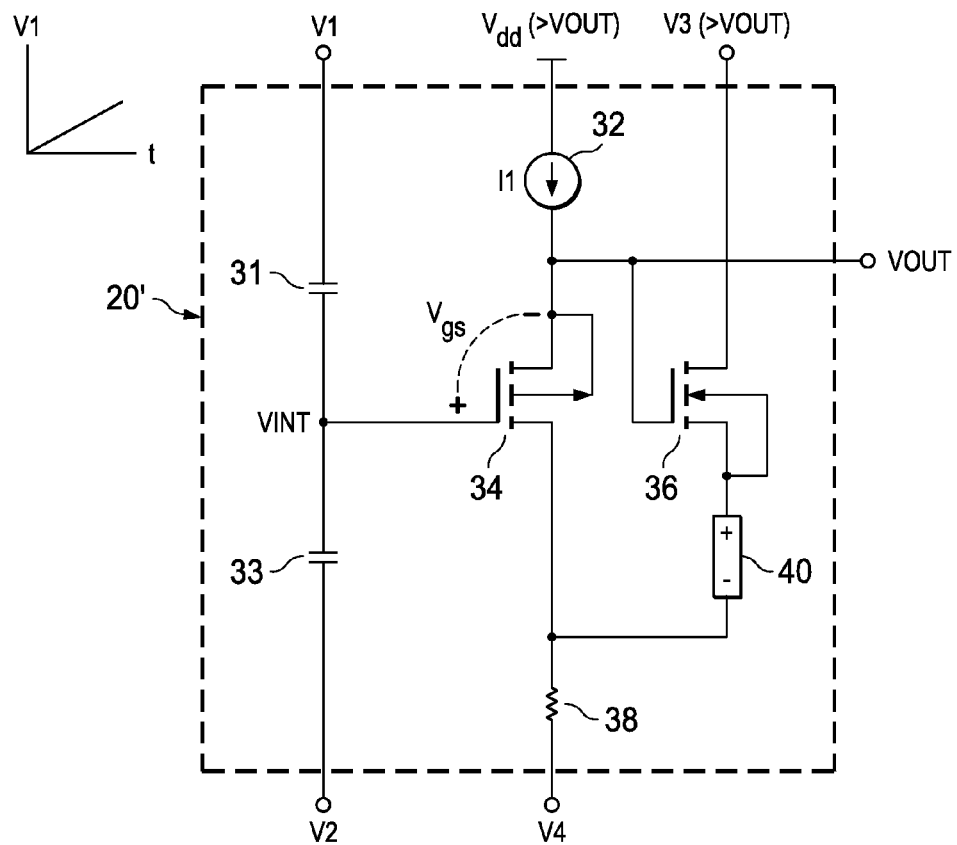
FIG. 4a is an electrical diagram, in schematic form, of a circuit for measuring capacitances according to another embodiment of the invention.
Figure 4B:
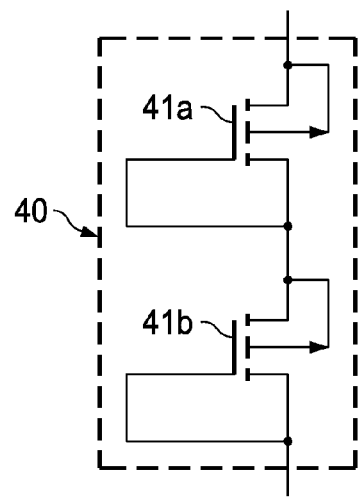
FIG. 4b is an electrical diagram, in schematic form, of a voltage source in the circuit of FIG. 4a according to that embodiment of the invention.

Referring now to FIGS. 4a and 4b, a circuit-based embodiment of this invention, in which the drain-to-source voltage of the source follower transistor is maintained substantially constant will now be described. According to this embodiment of the invention, as will become apparent, reduction of parasitic and drain effects at the source follower device is attained without requiring a special test sequence.

Test circuit 20' includes capacitors 31, 33, which are connected in series with one another between terminals V1 and V2. Intermediate node VINT is defined at the common node between capacitors 31, 33. As in the previously-described embodiment, test circuit 20' is intended to measure the relative capacitances C31, C33 of capacitors 31, 33, respectively. In measuring these relative capacitances, ramped voltage will be applied by automated test equipment (not shown) or otherwise to terminal V1 in this embodiment of the invention, and terminal V2 will be biased to a fixed reference voltage such as ground. P-channel MOS transistor 34 has its gate connected to intermediate node VINT and its source connected via current source 32 to power supply voltage $V_{dd}$; output terminal VOUT is connected to the source of transistor 34 in source follower fashion. The body node of transistor 34 is connected to its source, or alternatively to a substrate connection. The drain of transistor 34 is connected to terminal V4 via current limiting resistor 38; terminal V4 is connected to an appropriate bias voltage, which in this case may be at ground or another fixed voltage appropriate to place transistor 34 into saturation. Current source 32 conducts a substantially constant current I1 sufficient for saturation, as before.

According to this embodiment of the invention, test circuit 20' also includes n-channel MOS transistor 36. Transistor 36 has its gate connected to the source node of transistor 34, its drain connected to terminal V3, and its body node connected to its source. The source of transistor 36 is connected via voltage source 40 to the drain of transistor 34, which as described above is connected via current limiting resistor 38 to terminal V4. Voltage source 40 includes one or more components selected to ensure that the source of transistor 36 is maintained at a substantially fixed voltage above that of the drain of transistor 34. FIG. 4b illustrates one realization of voltage source 40 according to this embodiment of the invention, by way of the series connection of two p-channel MOS transistors 41a, 41b, each arranged in diode fashion with gate connected to drain, and body node connected to source, and with the body nodes of transistors 41a, 41b isolated from one another. In this realization, the number of diode-connected transistors 41 depends on the desired voltage drop between the source of transistor 36 and the drain of transistor 34, and can vary from one to several such transistors 41. Other realizations of voltage source 40 can alternatively be used, as will be apparent to those skilled in the art having reference to this specification.

Further in the alternative, the channel conductivity types of transistors 34, 36 may be reversed from that shown in FIG. 4a (i.e., with n-channel transistor 34 and p-channel transistor 36). In such an alternative implementation, the orientation and interconnection of source and drain nodes will, of course, be modified accordingly, as will be appreciated by those of ordinary skill in the art having reference to this specification.

The foregoing description refers to current I1 provided by current source 32 as substantially constant, and to the voltage drop across voltage source 40 as substantially constant. As will be evident from the following description, the extent to which this current and voltage are maintained constant is reflected in the precision with which the voltage at output terminal VOUT tracks the voltage divider voltage at intermediate node VINT. In combination with the expected bias conditions and operational ranges, conventional design techniques may be used to design and realize current source 32 and voltage source 40 to provide constant current and voltage, respectively, to the precision desired and attainable in the ultimate measurement, given the manufacturing technology used in implementation.

In operation, test circuitry external to test circuit 20', such as automated test equipment, laboratory bench equipment, or circuitry internal to an integrated circuit within which test circuit 20' is implemented, applies the desired bias voltages to terminals V2, V3, V4, and power supply voltage $V_{dd}$. As mentioned above, proper bias of test circuit 20' will place both of transistors 34, 36 into saturation, with current source 32 conducting current I1 and voltage source 40 enforcing the desired voltage drop between the source of transistor 36 and the drain of transistor 34. For example, terminals V2, V4 may be biased to ground; terminal V3 may be biased to power supply voltage $V_{dd}$ (along with current source 22 itself, as shown) or to another voltage above the expected maximum voltage at output terminal VOUT. Power supply voltage $V_{dd}$ should also be at a voltage above the expected maximum voltage at output terminal VOUT, so that the full expected output range can be observed.

To measure the relative capacitances C31, C33 of capacitors 31, 33, respectively, the external test circuitry applies a ramped voltage to terminal V1 while measuring the voltage at output terminal VOUT. Because transistor 34 is biased into the saturation region and is conducting a substantially constant source-drain current I1, as mentioned above, the gate-to-source voltage of transistor 34 will remain constant as the voltage at intermediate node VINT increases with the ramping voltage at terminal V1. The voltage at output terminal VOUT thus tracks the voltage at intermediate node VINT, with a slope that corresponds to the relative capacitances of capacitors 31, 33, in the manner described above. This slope thus provides a measure of capacitive mismatch, as indicated by deviation of that slope from that expected based on the nominal capacitances according to design.

According to this embodiment of the invention, the accuracy of this measurement is improved by the operation of transistor 36 in maintaining the drain-to-source voltage of transistor 34 substantially constant. As mentioned above, the bias voltage at terminal V3 is sufficiently high to place transistor 36 into saturation; resistor 38 limits the current conducted by transistor 36 to avoid overcurrent failure. This occurs so long as the voltage at terminal V3 exceeds the voltage at output terminal VOUT by more than the threshold voltage of transistor 36, which will generally be the case considering that the voltage at output terminal VOUT will be tracking the voltage at intermediate node VINT in the capacitor voltage divider. In saturation, the gate-to-source voltage of transistor 36 will remain constant. The voltage drop across voltage source 40 will also remain constant, for example at two diode threshold voltage drops for the construction shown in FIG. 4b. This operation of transistor 36 and voltage source 40 enforces a constant voltage between the source of transistor 34 at output terminal VOUT (which is also at the gate of transistor 36) and the drain of transistor 34, namely at the sum of the gate-to-source voltage of transistor 36 plus the drop across voltage source 40. As described above, with both the drain-to-source voltage and the gate-to-source voltage of transistor 34 held constant, the parasitic capacitances presented by transistor 34 to intermediate node VINT do not vary over the applied voltage range, eliminating non-linearities in the output voltage at terminal VOUT resulting from voltage-dependent charging and discharging of those parasitic capacitances. Threshold voltage shifts due to drain effects at transistor 34 are also greatly reduced in test circuit 20', even for minimum feature size devices. The resulting measurement of capacitive mismatch is thus more precise according to this embodiment of the invention than according to conventional techniques.

As compared with the embodiment of this invention described in connection with FIGS. 3a and 3b, test circuit 20' of FIG. 4a has the additional advantage of requiring fewer test pads. For example, if terminals V3 and V4 are biased to power supply voltage $V_{dd}$ and ground, respectively, that bias can be provided by routing conductors to test circuit 20' and does not require additional test pads for those terminals V3, V4. As a result, the only test pads required in the scribe line implementation of test circuit 20' will be for input terminal V1 and output terminal VOUT, in addition to the pads or conductors for power supply voltage $V_{dd}$ and ground.

In addition, it is contemplated that the test time involved in measuring capacitor mismatch using test circuit 20' can be reduced for this embodiment of the invention, relative to that contemplated in ramping both voltages in the previously-described embodiment of the invention.

Figure 1:
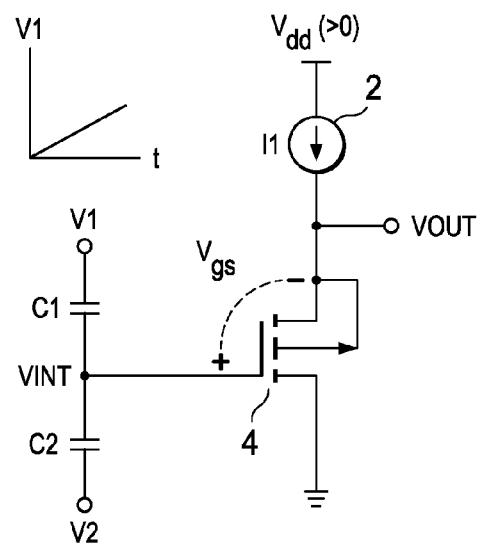
FIG. 1 is an electrical diagram, in schematic form, of a conventional circuit for measuring relative capacitances of two capacitors.

In each of these embodiments of the invention, the precision with which capacitive mismatch can be measured is greatly improved over conventional techniques such as that described above in connection with FIG. 1. As mentioned above, threshold voltage modulation of on the order of 10 mV has been observed in source follower devices having a nominal threshold voltage of about 0.35 volts, over a typical voltage ramp capacitor mismatch measurement. In contrast, it has been observed via simulation that threshold voltage modulation of less than about 1 mV over the same measurement conditions, for both of the embodiments of the invention described above. This reduction in threshold voltage modulation eliminates a large source of non-linearity at the source follower output, and thus substantially improves the ability to precisely measure capacitor mismatch in modern integrated circuits.

While this invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of measuring the capacitance of a first capacitor relative to a second capacitor, comprising the steps of:
    connecting the first and second capacitors in series with one another between a first terminal at one plate of the first capacitor and a second terminal at one plate of the second capacitor;
    connecting a common node between the first and second capacitors to a gate of a first transistor;
    biasing source and drain nodes of the first transistor so that the first transistor conducts a substantially constant current in saturation;
    ramping an applied voltage at the first terminal relative to the second terminal;
    during the ramping step, maintaining a substantially constant drain-to-source voltage at the first transistor; and
    during the ramping step, measuring an output voltage at the source node of the first transistor, wherein the step of maintaining the substantially constant drain-to-source voltage comprises:
    determining an approximate capacitance ratio between the first and second capacitors;
    during the ramping step, applying a ramped voltage at the drain node of the first transistor at a time-rate-of-change corresponding to a product of a capacitance voltage divider ratio at the common node between the first and second capacitors and the time-rate-of-change of the applied voltage at the first terminal.

2. A method of measuring the capacitance of a first capacitor relative to a second capacitor, comprising the steps of:
    connecting the first and second capacitors in series with one another between a first terminal at one plate of the first capacitor and a second terminal at one plate of the second capacitor;
    connecting a common node between the first and second capacitors to a gate of a first transistor;
    biasing source and drain nodes of the first transistor so that the first transistor conducts a substantially constant current in saturation;
    ramping an applied voltage at the first terminal relative to the second terminal;
    during the ramping step, maintaining a substantially constant drain-to-source voltage at the first transistor; and
    during the ramping step, measuring an output voltage at the source node of the first transistor, wherein the step of maintaining the substantially constant drain-to-source voltage comprises:
    biasing a second transistor into saturation, the second transistor having a gate coupled to the source node of the first transistor, and having a source/drain path connected in series with a voltage source between a bias terminal and the drain node of the first transistor.

3. The method of claim 2, wherein the voltage source comprises at least one transistor having its gate connected to its drain node.

4. A circuit for measuring relative capacitance, comprising:
    a first capacitor, having a plate coupled to a first bias node;
    a second capacitor, having a plate coupled to second bias node, and connected in series with the first capacitor between the first and second bias nodes;
    a first transistor having a gate connected to a common node between the first and second capacitors, having a drain coupled to a third bias node, and having a source connected to an output terminal;
    a current source connected in series with the source/drain path of the first transistor between the third and a fourth bias nodes, for supplying a substantially constant source/drain current to the first transistor;
    a second transistor, having a gate connected to the source of the first transistor, having a drain coupled to a fifth bias node, and having a source; and
    a voltage element coupled between the source of the second transistor and the drain of the first transistor.

5. The circuit of claim 4, wherein the first transistor is a p-channel MOS transistor and the second transistor is an n-channel MOS transistor.

6. The circuit of claim 4, wherein the voltage element comprises at least one transistor having a source/drain path connected between the drain of the first transistor and the source of the first transistor, and having a gate connected to its drain.

7. The circuit of claim 4, wherein the first and second capacitors are of different construction from one another.

8. The circuit of claim 7, wherein the first capacitor comprises first and second plates formed of a metal, and a dielectric film disposed between the first and second plates;
and wherein the second capacitor comprises:
a first plate formed in an active region of a substrate;
a gate dielectric film disposed over the first plate; and
a second plate disposed over the gate dielectric film.

9. The circuit of claim 8, wherein the second plate of the second capacitor is comprised of polycrystalline silicon.

10. The circuit of claim 8, wherein the first capacitor further comprises third and fourth plates formed of a metal with the dielectric film disposed between the third and fourth plates, the third and fourth plates disposed adjacent the first and second plates, respectively, to form a lateral flux capacitor.

11. A semiconductor wafer, comprising:
a semiconductor body;
a plurality of integrated circuits disposed at the surface of the semiconductor body;
at least one circuit disposed between first and second ones of the plurality of integrated circuits, and comprising:
a first capacitor, having a plate coupled to a first bias node;
a second capacitor, having a plate coupled to second bias node, and connected in series with the first capacitor between the first and second bias nodes;
a first transistor having a gate connected to a common node between the first and second capacitors, having a drain coupled to a third bias node, and having a source connected to a VOUT terminal;
a current source connected in series with the source/drain path of the first transistor between the third and a fourth bias nodes, for supplying a substantially constant source/drain current to the first transistor;
a second transistor, having a gate connected to the source of the first transistor, having a drain coupled to a fifth bias node, and having a source; and
a voltage element coupled between the source of the second transistor and the drain of the first transistor.

12. The wafer of claim 11, further comprising:
a first bond pad disposed at the surface of the body and electrically connected to the first bias node; and
a second bond pad disposed at the surface of the body and electrically connected to the source of the first transistor.

13. The wafer of claim 11, wherein the first and second capacitors are of different construction from one another.

14. The wafer of claim 13, wherein the first capacitor comprises first and second plates formed of a metal, and a dielectric film disposed between the first and second plates;
and wherein the second capacitor comprises:
a first plate formed in an active region at the surface;
a gate dielectric film disposed over the first plate; and
a second plate disposed over the gate dielectric film.

15. The wafer of claim 11, wherein the first transistor is a p-channel MOS transistor and the second transistor is an n-channel MOS transistor.

16. The wafer of claim 11, wherein the voltage element comprises at least one transistor having a source/drain path connected between the drain of the first transistor and the source of the first transistor, and having a gate connected to its drain.

* * * * *